(12) United States Patent
Feyh et al.

(10) Patent No.: US 8,165,324 B2
(45) Date of Patent: Apr. 24, 2012

(54) MICROMECHANICAL COMPONENT AND METHOD FOR ITS PRODUCTION

(75) Inventors: Ando Feyh, Tamm (DE); Marco Lammer, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 771 days.

(21) Appl. No.: 12/227,385

(22) PCT Filed: Apr. 2, 2007

(86) PCT No.: PCT/EP2007/053182
§ 371 (c)(1),
(2), (4) Date: Nov. 13, 2008

(87) PCT Pub. No.: WO2007/137893
PCT Pub. Date: Dec. 6, 2007

(65) Prior Publication Data
US 2009/0232334 A1    Sep. 17, 2009

(30) Foreign Application Priority Data

May 26, 2006    (DE) .......................... 10 2006 024 668

(51) Int. Cl.
*H04R 25/00*    (2006.01)
(52) U.S. Cl. ........ 381/174; 381/173; 381/190; 381/191; 438/53
(58) Field of Classification Search ................. 381/174, 381/173, 190, 191; 438/53
See application file for complete search history.

(56) References Cited

U.S. PATENT DOCUMENTS

| | | | |
|---|---|---|---|
| 6,243,474 B1 | 6/2001 | Tai et al. | |
| 2004/0114775 A1* | 6/2004 | Chang | 381/191 |
| 2004/0237658 A1* | 12/2004 | Ohms et al. | 73/718 |
| 2004/0259286 A1* | 12/2004 | Dehe et al. | 438/50 |
| 2006/0170012 A1* | 8/2006 | Larmer et al. | 257/252 |

FOREIGN PATENT DOCUMENTS

| | | |
|---|---|---|
| EP | 0561566 | 9/1993 |
| EP | 1215476 | 6/2002 |
| JP | 60-121400 | 6/1985 |
| JP | 7-50899 | 2/1995 |
| JP | 2003-531017 | 10/2003 |
| JP | 2006-75981 | 3/2006 |
| WO | WO 2005/120130 | 12/2005 |
| WO | WO 2006/013137 | 2/2006 |

OTHER PUBLICATIONS

Bergqvist J. et al.: "A New Condenser Microphone in Silicon" Sensors and Actuators A, Elsevier Sequoia S.A., Lausanne, CH, vol. A21-A23, Feb. 1, 1990, pp. 123-125, XP000573229 ISSN: 0924-4247 figure 1, paragraphs [Transducer], [Fabrication].

* cited by examiner

*Primary Examiner* — Andy Huynh
(74) *Attorney, Agent, or Firm* — Kenyon & Kenyon LLP

(57) ABSTRACT

A cost-effective technology for implementing a micromechanical component is provided, whose layer construction includes at least one diaphragm on the upper side and at least one counter-element, a hollow space being formed between the diaphragm and the counter-element, and the counter-element having at least one through hole to a back volume. This back volume is formed by a sealed additional hollow space underneath the counter-element and is connected to the upper-side of the layer construction by at least one pressure equalization opening. This component structure permits the integration of the micromechanical sensor functions and evaluation electronics on one chip and is additionally suitable for mass production.

15 Claims, 5 Drawing Sheets

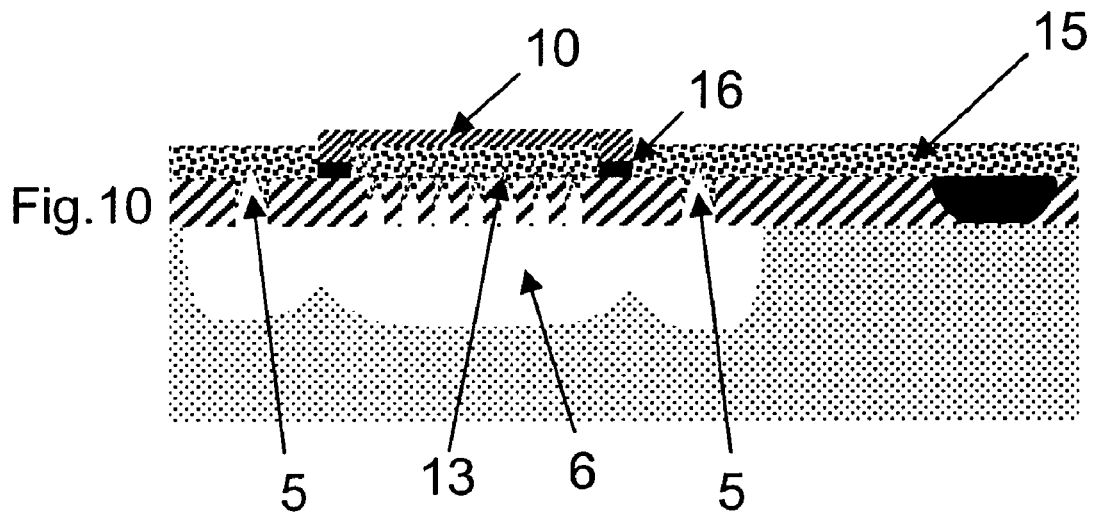
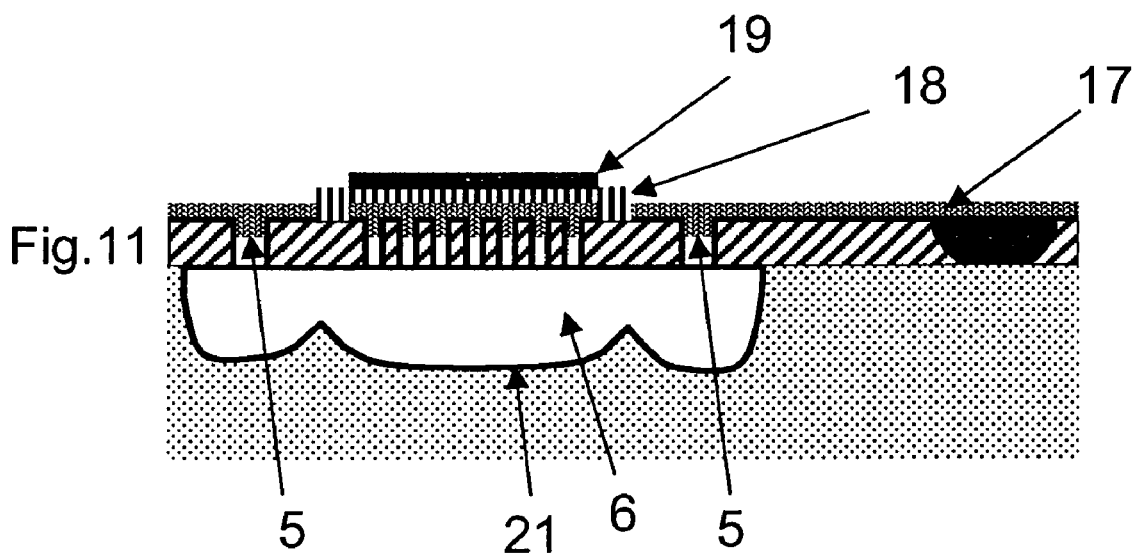

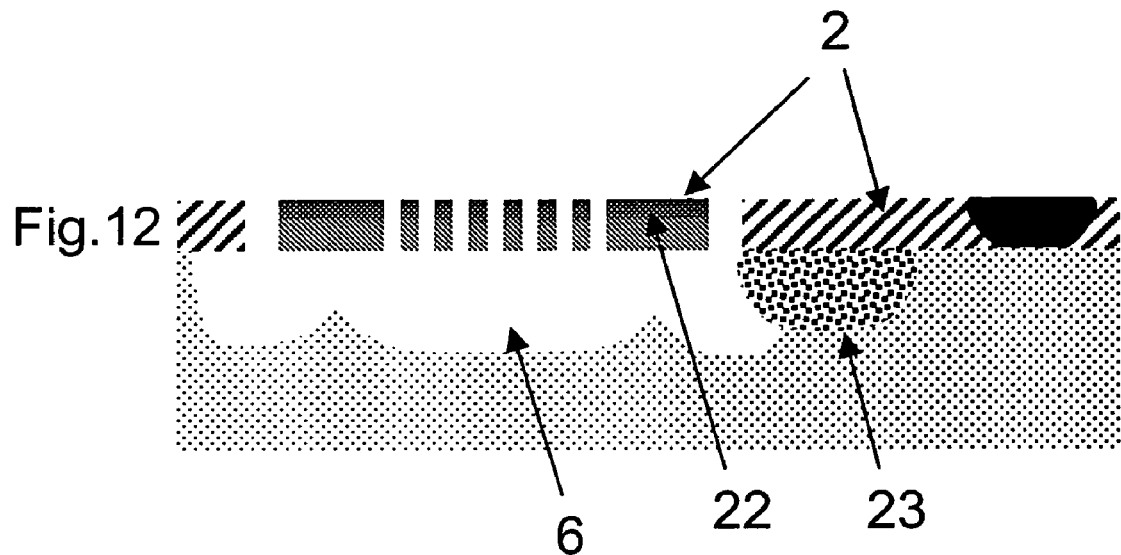
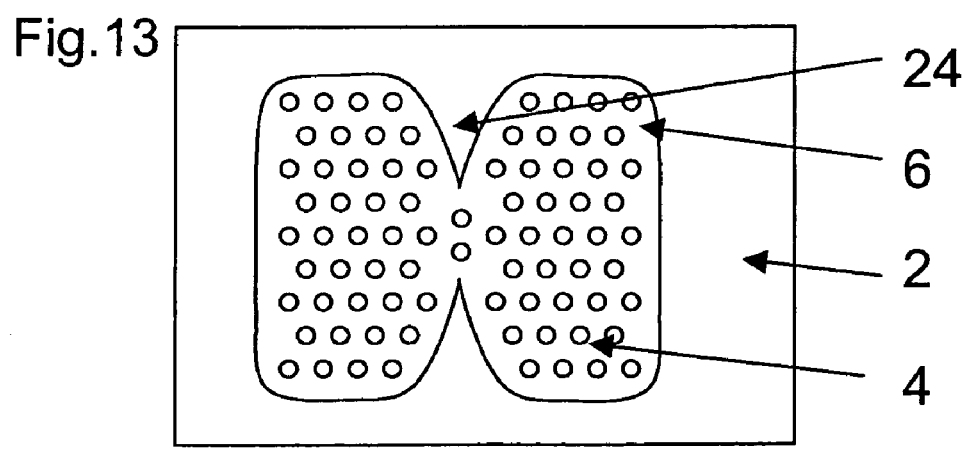

MICROMECHANICAL COMPONENT AND METHOD FOR ITS PRODUCTION

FIELD OF THE INVENTION

The present invention relates to a micromechanical component having a layer construction that includes at least one diaphragm on the upper side and at least one counter-element, a hollow space being formed between the diaphragm and the counter-element, and the counter-element having at least one through hole to a back volume. Furthermore, the present invention relates to a method for producing such a component.

BACKGROUND INFORMATION

In practice, such components are frequently used as microphone elements, as part of hearing devices or mobile communication systems, for example. In this instance, the diaphragm acts as a sound sensor. In the case of microphones that operate in a capacitive manner, the counter-element is designed as a counter-electrode for the diaphragm that likewise acts as an electrode. The through holes in the counter-element enable a pressure equalization to the back volume.

A component of the type mentioned at the outset is discussed in the German patent application 10 2005 042664.6. The layer construction of this component includes a diaphragm that was produced by surface-micromechanical processing. It is elevated above the remaining chip area and spans a hollow space whose floor is formed by a counter-element. The backside of the counter-element was exposed by backside processing of the layer construction. In addition to this, the counter-element has through holes so that the pressure equalization takes place in this instance via the backside of the component.

Many applications for components of the type discussed here require a high level of miniaturization. This may be achieved on the one hand by downsizing the micromechanical structure elements, whereby the electroacoustic performance should be maintained or even improved, and on the other hand by integrating the evaluation electronics on the same chip. However, both measures are compatible with a backside processing of the layer construction only to a limited extent, as described in the related art.

SUMMARY OF THE INVENTION

The exemplary embodiments and/or exemplary methods of the present invention provides a cost-effective technology that is able to simply integrate on one chip the micromechanical sensor functions and the evaluation electronics, and is also suitable for mass production.

To this end, the component concept according to the present invention provides that the back volume of the component is formed by an additional sealed hollow space underneath the counter-element and that the additional hollow space underneath the counter-element is connected to the upper-side of the layer construction by at least one pressure-equalization opening.

The structure of the component according to the present invention is designed such that it is able to be produced by purely surface-micromechanical processing (SMM). A processing of the backside of the layer construction in bulk micromechanics (BMM) is not necessary, which means that additional process steps and thus production costs are saved. An additional advantage of the purely surface-micromechanical processing lies in the multitude of feasible designs and models in minimal structure size. Thus, for example, SMD-appropriate chips having a small size are able to be produced by SMM, which is not possible with BMM. Furthermore, the SMM technology is able to be combined with the production techniques of microelectronics so that cost-effective batch processes are able to be implemented for the mass production of the component according to the present invention. Since the SMM and CMOS processes are compatible as a rule, sensor structure and evaluation electronics are also able to be simply integrated on one chip.

In one advantageous variant of the component according to the present invention, the hollow space underneath the counter-element has at least one constriction. Alternatively, this hollow space is also able to be formed by several cavities that communicate with one another. In this case, the wall of the hollow space forms a support for the counter-element and increases its mechanical stability. Consequently, the process freedom for the production of the component according to the present invention increases, for example, for a planarization of the counter-element with the aid of plasma or CMP.

One advantageous further refinement of the component according to the present invention provides blocking the pressure equalization openings on the upper-side of the layer construction to divert to the side the pressure connection of the hollow space underneath the counter-element. In this way, it is possible to avoid simply a situation in which the pressure incident on the diaphragm also reaches the hollow space underneath the counter-element through the pressure equalization openings. In this way, it is guaranteed that this hollow space forms a equalization volume for the hollow space between the diaphragm and the counter-element. This type of blocking of the pressure equalization openings is able to be realized in the form of a bonded cap wafer, for example.

As was already mentioned, the structure of the component according to the present invention is able to be produced by purely surface-micromechanical processing. To this end, the method according to the present invention for producing such a component assumes a substrate on which at least one first layer is produced. In this first layer, openings that extend at least up to the substrate are produced, at least one opening being disposed as a through hole in the counter-element in the region of the diaphragm to be produced, and at least one opening being disposed as a pressure equalization opening in a region near the diaphragm to be produced. In a first etching step, which takes place starting from the upper-side of the layer construction via the openings in the first layer, a hollow space is produced in the substrate underneath the first layer.

Then at least one sacrificial layer is produced above the patterned first layer, the openings in the first layer being sealed. A frame region for the diaphragm is produced in this sacrificial layer, and above the sacrificial layer at least one layer out of the diaphragm material is deposited and patterned. Afterward, the diaphragm is exposed, in that the sacrificial layer material is removed in a second etching step, which takes place starting from the upper-side of the layer construction via the pressure equalization opening in the first layer, the hollow space under the first layer, and the through hole in the counter-element.

In general, there are different possibilities for implementing, designing, and refining the method according to the present invention. For this purpose, reference is made, on the one hand, to the claims that are dependent on the independent method claim, and on the other hand, to the following description of exemplary embodiments of the present invention based on the drawing.

FIGS. 1 to 9 illustrate the sequence of the method steps for producing a component according to the present invention.

FIGS. 10 to 13 illustrate advantageous variants of the production method and for this reason respectively relate only to one aspect of the production method.

BRIEF DESCRIPTION OF THE DRAWINGS

FIG. 10 is a sectional view of the layer construction.
FIG. 11 is a sectional view of the layer construction.
FIG. 12 is a sectional view of the layer construction.
FIG. 13 illustrates a top view of the upper-side of the layer construction.

DETAILED DESCRIPTION

FIGS. 1 to 9 illustrate the sequence of the method steps for producing a component according to the present invention.

FIGS. 10 to 13 illustrate advantageous variants of the production method and for this reason respectively relate only to one aspect of the production method.

As explained above, the structure of the component according to the present invention is implemented in a layer construction by surface-micromechanical processing of a substrate. In the exemplary embodiment described here, a p-doped silicon substrate 1, which may have any doping and orientation, serves as the starting material.

Figure 1:
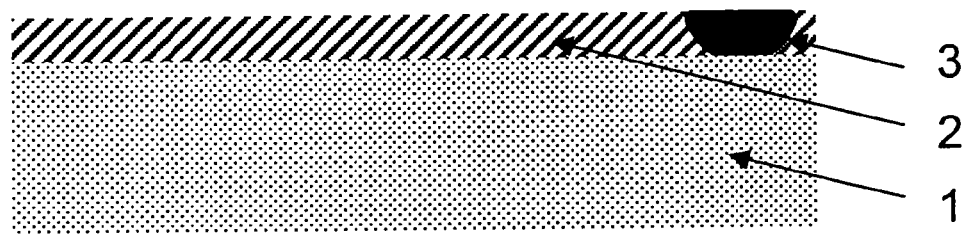
FIG. 1 is a sectional view of the layer construction.

The (100) oriented material having a specific resistance of 2.75 Ohm/cm may be used, to be able to revert to standard CMOS processes. FIG. 1 illustrates substrate 1 after the application of a first layer 2, in which the counter-element of the component structure is designed in the following. In this instance, layer 2 is an n-doped epitaxy layer having a thickness which may be between 2 and 10 µm. Such a layer may also be produced through POC13 coating or implantation. An ASIC 3 was integrated in layer 2 as an evaluation circuit for the component. Where necessary, it may be protected against the surface-micromechanical processing described below by a masking layer not shown here.

Figure 2:
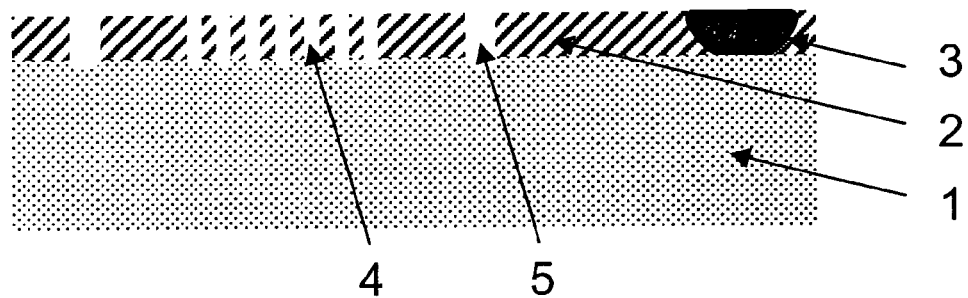
FIG. 2 is a sectional view of the layer construction.
Figure 3:
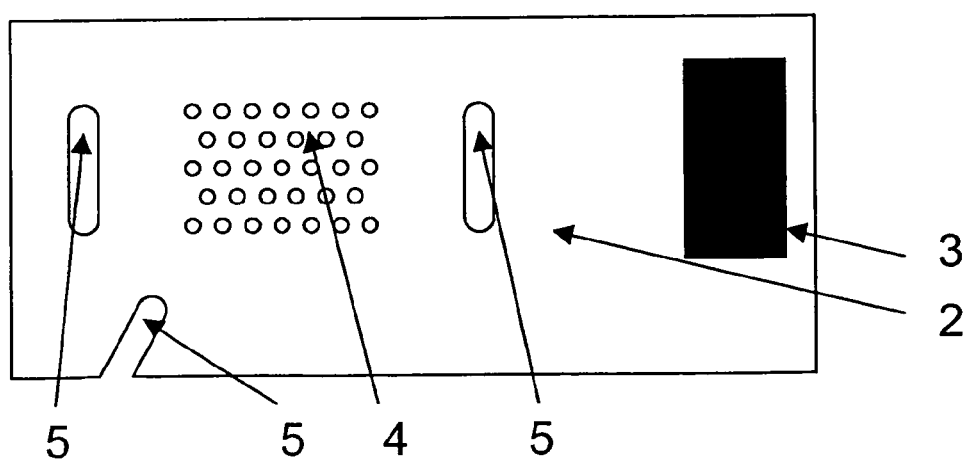
FIG. 3 illustrates a top view of the upper-side of the layer construction shown in FIG. 2.

Openings 4 and 5 are produced in first layer 2 in a next method step, which is illustrated by FIGS. 2 and 3. In this instance, these openings 4 and 5 are etched in a trench process and extend into substrate 1. Openings 4 are designed as through holes in the counter-element in the region under the diaphragm that is yet to be produced, while openings 5 are disposed as pressure equalization openings in a region near the diaphragm to be produced. FIG. 3 illustrates a top view of one possible disposition and geometry of openings 4 and 5. Thus, smaller openings 4, for example, having a diameter of approximately 0.5 to 3 µm, may be generated in the diaphragm region. Openings 4 are disposed hexagonally here. However, another number and disposition of openings 4 may be selected just as well. Openings 5 have a clearly larger design, having a length of up to several 10 µm. Openings 5 on the side of the diaphragm region may also be disposed in any manner. Distances between several 10 µm up to 300 µm to the diaphragm region are typical. As illustrated in FIG. 3, openings 5 may also be disposed in the edge region of the layer construction, so that the pressure equalization may take place on the side when the component is being operated.

Figure 4:
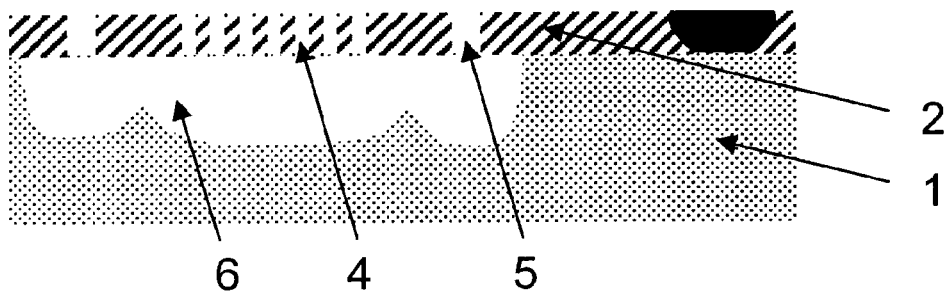
FIG. 4 is a sectional view of the layer construction.

In the subsequent first etching step, which proceeds from the upper-side of the layer construction, openings 4 and 5 also act as etching openings via which a hollow space 6 is produced in substrate 1 under first layer 2. In the exemplary embodiment described here, the first etching step includes an electropolishing step in hydrofluoric acid (HF). In this instance, only the p-doped silicon substrate 1 is attacked. The n-doped first layer 2, on the other hand, is not attacked due to the high doping selectivity of the electrochemical dissolving of silicon. The depth of hollow space 6 may come to 300 µm without any problem. Depending on the process parameter setting, etching rates of up to 10 µm/sec may be implemented. Typically, the HF concentration falls between 5 and 40% m, the effect being able to be improved even more by the addition of a wetting agent having a content between 5 and 30% vol. Depending on the HF concentration, the current densities are several 10 mA/cm2 to several A/cm2. The reaction gases appearing during the reaction may escape through openings 4, 5 without destroying perforated first layer 2. FIG. 4 illustrates the layer construction after this first etching step, in which a contiguous hollow space 6 was formed underneath openings 4 and 5.

Figure 5:
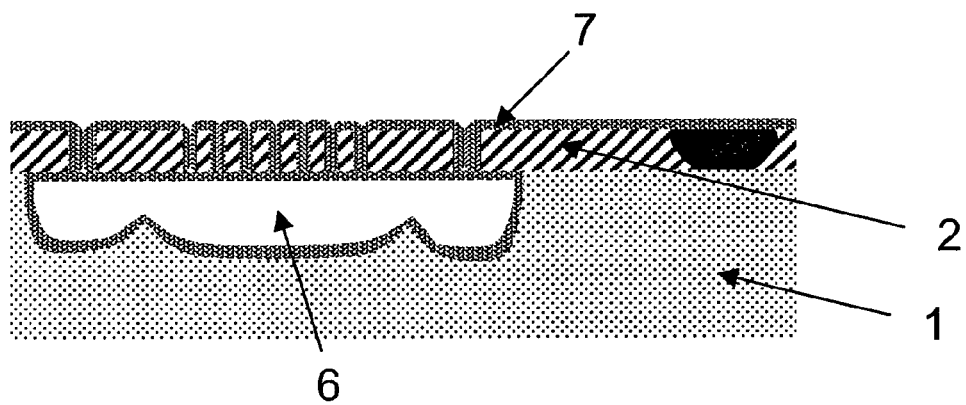
FIG. 5 is a sectional view of the layer construction.

In a next method step, a sacrificial layer 7 is applied on perforated first layer 2, the openings 4 and 5 in first layer 2 being sealed. To this end, in the exemplary embodiment described here, SiGe is deposited on first layer 2 in an LPCVD in a largely conformal manner. FIG. 5 illustrates the layer construction after sacrificial layer 7 reaches a layer thickness that corresponds to half of the opening diameter, so that openings 4 and 5 are sealed. Typically, 0.5 to 2 µm of SiGe are deposited. In this connection, the smallest dimension of openings 5 determines the layer thickness required for closing.

Figure 6:
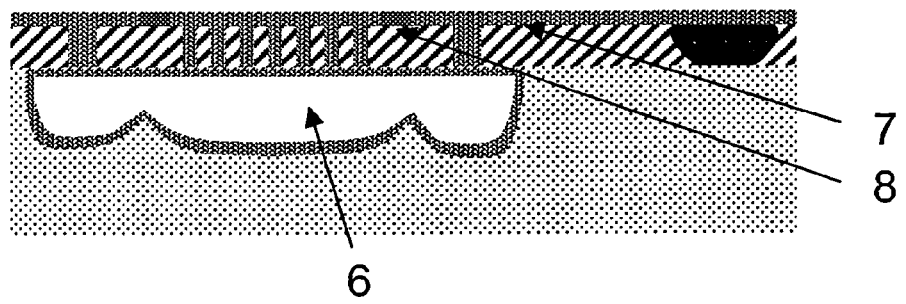
FIG. 6 is a sectional view of the layer construction.

Subsequently, sacrificial layer 7 is planarized. In addition, a frame region 8 is processed, which is shown in FIG. 6. In this instance, SiO2 serves as an insulating material.

Figure 7:
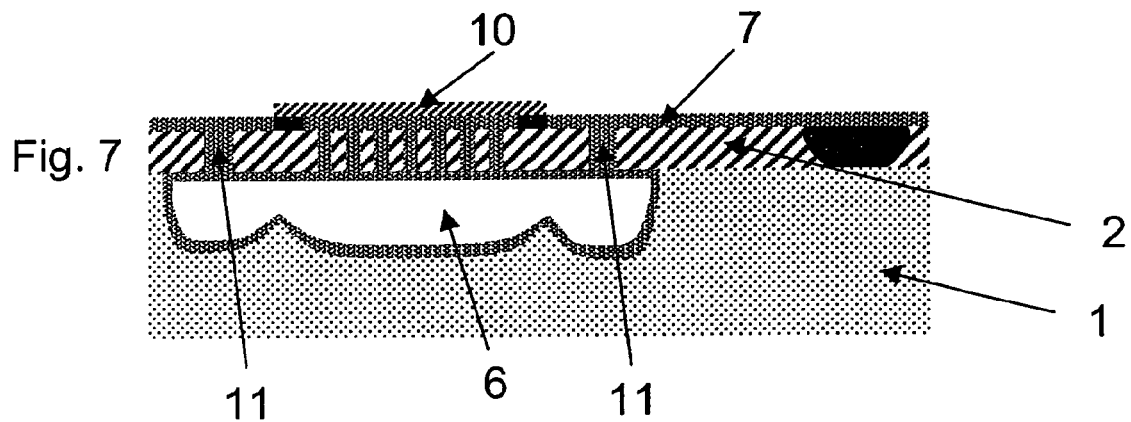
FIG. 7 is a sectional view of the layer construction.

FIG. 7 illustrates the layer construction after a doped polysilicon layer 10 is deposited and patterned above sacrificial layer 7 to produce a diaphragm from doped polysilicon. The diaphragm is to act as a sensor for the sound pressure and acts as an electrode for the capacitive evaluation of the diaphragm deformation. The sacrificial layer material in the pressure equalization openings 5 is labeled here with 11.

Figure 8:
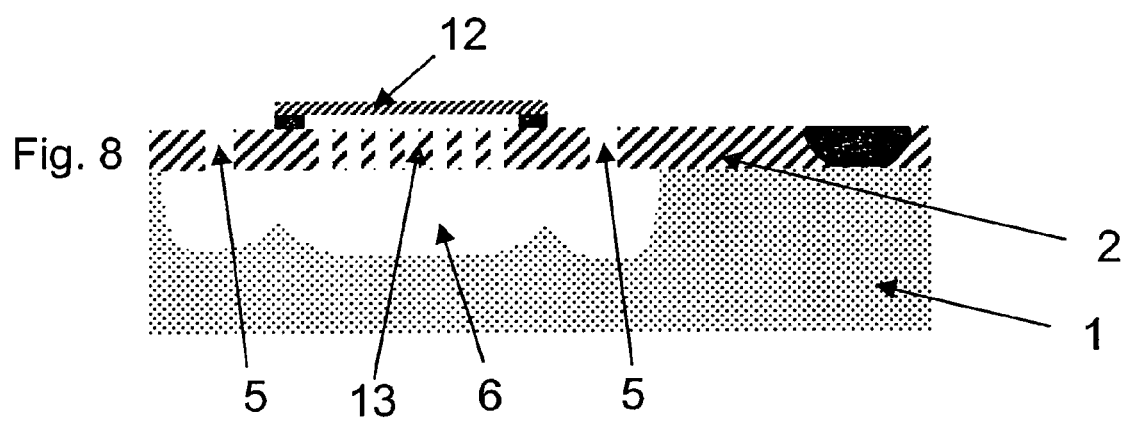
FIG. 8 is a sectional view of the layer construction.

In the next method step, diaphragm 12 is exposed, in that all sacrificial layer material SiGe is removed using ClF3 etching. In this context, neither the polysilicon of diaphragm 12, nor silicon substrate 1, nor the SiO2 of frame region 8 is attacked. The etch attack proceeds from the upper-side of the layer construction. First, the freely available material of sacrificial layer 7 on first layer 2 is removed. Then sacrificial layer material 11 in pressure equalization openings 5 is removed, so that the etching medium is able to penetrate hollow space 6 under first layer 2 and is also able to attack the sacrificial layer material on the wall of hollow space 6. From here, finally the sacrificial layer material in openings 4 and under diaphragm 12 is also removed. Diaphragm 12 is thus exposed by etching the sacrificial layer material through the outwardly-situated pressure equalization openings 5 and hollow space 6. The result of this second etching step, namely a self-supporting, sealed diaphragm 12 above a perforated counter-electrode 13, is illustrated in FIG. 8. A large equalization volume can be found underneath this capacitor structure in the form of hollow space 6.

Figure 9:
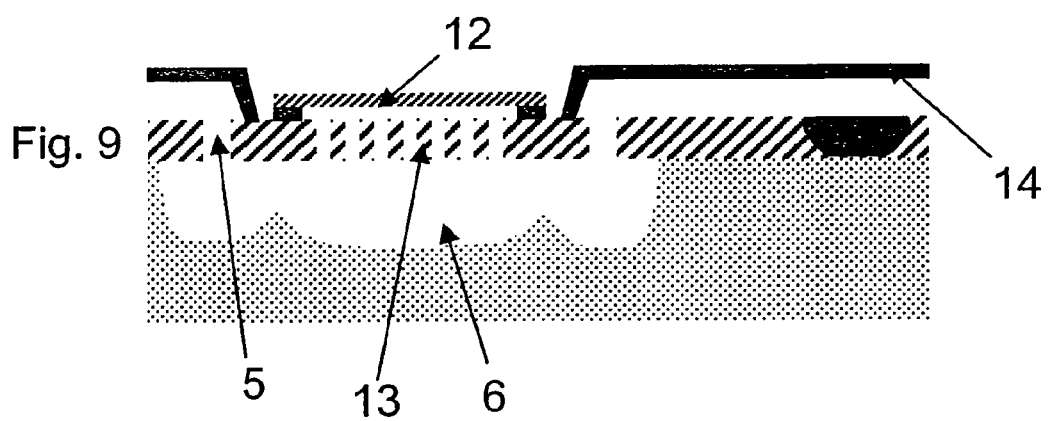
FIG. 9 is a sectional view of the layer construction.

The exposed pressure equalization openings 5 are subsequently led off to the side or to the back by cap wafers 14 in such a way that sound pressure incident on diaphragm 12 is not able to reach equalization volume 6 via pressure equalization openings 5. FIG. 9 illustrates the layer construction having two bonded cap wafers 14.

As part of the method according to the present invention for producing a component, as shown in FIG. 8, other sacrificial layer materials may also be implemented instead of SiGe. For example, a PECVD oxide is suitable for this, as shown in FIG. 10. While in the depositing of SiGe on first layer 2 the wall of hollow space 6 is also coated via openings 4 and 5 until these are sealed, in this instance openings 4 and 5 are sealed by the PECVD oxide of sacrificial layer 15 without an oxide layer developing on the wall of hollow space 6. In this manner, it is possible to implement larger distances between the diaphragm and the perforated counter-electrode. Frame region 16, which forms the electric insulation between diaphragm and counter-electrode, may be implemented here by SiN or also by p-doping. After a polysilicon layer has been deposited and patterned as a diaphragm, SiO2-sacrificial-layer 15 is selectively etched out by HF vapor etching.

Furthermore, the sacrificial layer may be made up of doped polysilicon, as shown in FIG. 11. In this case, the silicon structure is passivated by thermal oxidation 21 before applying sacrificial layer 17. A few ten nm of oxide suffice for this purpose, so that that resulting stress is negligible. Here too, openings 4 and 5 are sealed with the sacrificial layer material. A dielectric 18 is used as a diaphragm material. For example, SiO2, SiN, Si3N4 or SiC are suitable for this. The electric connection is implemented by sputtering a thin metal layer 19.

The conductivity of perforated n-doped counter-electrode 13 may be selectively increased in that the doping of counter-electrode 13 is adjusted by additional near-surface implantation. This is shown in the form of shading 22 in FIG. 12. The doping of n-epitaxy layer 2 is typically under $10^{15}/cm^3$. That is, the specific resistance is greater than 10 Ohmcm. Furthermore, in FIG. 12 an n-doped zone 23 is illustrated in substrate 1 in the edge region of hollow space 6 underneath layer 2. This zone 23 was produced before depositing layer 2. It operates as a depth mask and increases locally the stability of the component structure.

If an anti-stiction layer is required beneath the diaphragm, it can be added before depositing the diaphragm, for example, or after etching the sacrificial layer through the pressure equalization openings, by using conforming low-pressure processes.

The performance and stability of the component according to the exemplary embodiments and/or exemplary methods of the present invention depend fundamentally on the size and form of hollow space 6 underneath counter-element 13. Through a cleverly contrived disposition of through holes 4 in counter-element 13, it is possible to ensure that a single large hollow space 6 does not develop, but rather multiple smaller contiguous hollow spaces that are partially separated by supporting connections or constrictions 24. FIG. 13 illustrates a top view of a component having a hollow space formed in this manner. Supporting connections 24 improve the mechanical stability of counter-element 13 lying above hollow space 6, so that more process freedom exists when producing the component.

In conclusion, reference is made to the fact that the component according to the exemplary embodiments and/or exemplary methods of the present invention is not restricted to an application as a microphone, but rather may also be configured simply for other applications, such as pressure measurement, for example, or as a sound transducer.

What is claimed is:

1. A micromechanical component having a layer construction, comprising:
   at least one diaphragm on an upper side of the layer construction; and
   at least one counter-element;
   wherein a hollow space is formed between the diaphragm and the at least one counter-element, the at least one counter-element includes at least one through hole to a back volume, wherein the back volume is formed by a sealed additional hollow space underneath the counter-element, and wherein the additional hollow space underneath the counter-element is connected to the upper side of the layer construction via at least one pressure equalization opening.

2. The component of claim 1, wherein the additional hollow space underneath the counter-element either (i) has at least one constriction, and (ii) is formed by several cavities that communicate with one another.

3. The component of claim 1, wherein the at least one pressure equalization opening is blocked on the upper side of the layer construction against undesired pressure influence.

4. The component of claim 1, wherein the diaphragm and the counter-element act as electrodes for the capacitive detection of diaphragm deformations.

5. The component of claim 1, wherein:
   the layer construction includes a substrate and at least one first layer above the substrate,
   the counter-element is formed in the first layer,
   the diaphragm is formed in at least one additional layer above the counter-element, and
   the additional hollow space is formed underneath the counter-element in the substrate.

6. A method for producing a component, having a layer construction that includes at least one diaphragm on an upper side of the layer construction and at least one counter-element, a hollow space being formed between the diaphragm and the counter-element and the counter-element having at least one through hole to a back volume, the method comprising:
   producing at least one first layer on a substrate;
   producing openings that extend at least up to the substrate in the first layer, at least one opening being disposed as a through hole in the counter-element in the region of the diaphragm to be produced, and at least one opening being disposed as a pressure equalization opening in a region near the diaphragm to be produced;
   producing, in a first etching step, which takes place starting from the upper-side of the layer construction via the openings in the first layer, a hollow space in the substrate underneath the first layer;
   producing at least one sacrificial layer above the patterned first layer, the openings in the first layer being sealed;
   producing in the sacrificial layer, a frame region for the diaphragm;
   depositing and patterning at least one layer made of diaphragm material above the sacrificial layer; and
   exposing the diaphragm, in that the sacrificial layer material is removed in a second etching step, which takes place starting from the upper-side of the layer construction via the pressure equalization opening in the first layer, the hollow space under the first layer, and the through hole in the counter-element;
   wherein the component is a micromechanical component having a layer construction, including at least one diaphragm on an upper side, and at least one counter-element, and wherein a hollow space is formed between the diaphragm and the at least one counter-element, the at least one counter-element includes at least one through hole to a back volume, wherein the back volume is formed by a sealed additional hollow space underneath the counter-element, and wherein the additional hollow space underneath the counter-element is connected to the upper side of the layer construction via at least one pressure equalization opening.

7. The method of claim 6, in which a p-doped silicon substrate is used as substrate, in which the first layer is formed by an n-doped silicon layer, in which the openings in the first layer are produced in a trench process, and in which the first etching step includes an electropolishing step in hydrofluoric acid.

8. The method of claim 7, in which the substrate surface is provided with an n-doping in some regions.

9. The method of claim 7, in which an additional doping is produced by near-surface implantation in the first layer in the region of the counter-element to be produced.

10. The method of claim 7, in which an SiGe layer is produced by LPCVD as a sacrificial layer and in which the second etching step includes ClF3 etching for removing the sacrificial layer material.

11. The method of claim 7, in which an SiO2 layer is produced by PECVD as a sacrificial layer and in which the second etching step includes HF vapor etching for removing the sacrificial layer material.

12. The method of claim 7, in which the diaphragm is formed in a doped polysilicon layer.

13. The method of claim 7, in which the silicon structure existing after the first etching step is passivated in particular by thermal oxidation, in which a polysilicon layer is produced as a sacrificial layer and in which a dielectric is used as diaphragm material, which includes at least one of SiO2, SiN, Si3N4 and SiC.

14. The method of claim 6, in which an insulating frame region for the diaphragm is produced one of (i) in the sacrificial layer in the form of one of an SiO2 and an SiN region, and (ii) by a p-doping.

15. The method of claim 6 in which at least one cap wafer is bonded to the layer construction in the region above the pressure equalization opening.

* * * * *